(12) United States Patent
Lin et al.

(10) Patent No.: US 10,872,769 B2
(45) Date of Patent: *Dec. 22, 2020

(54) FORMATION AND IN-SITU ETCHING PROCESSES FOR METAL LAYERS

(71) Applicant: Taiwan Semiconductor Manufacturing Co., Ltd., Hsinchu (TW)

(72) Inventors: Po-Yu Lin, Yilan County (TW);
Chi-Yu Chou, Zhubei (TW);
Hsien-Ming Lee, Changhua (TW);
Huai-Tei Yang, Hsinchu (TW);
Chun-Chieh Wang, Kaohsiung (TW);
Yueh-Ching Pai, Taichung (TW);
Chi-Jen Yang, New Taipei (TW);
Tsung-Ta Tang, Hsinchu (TW);
Yi-Ting Wang, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/729,725

(22) Filed: Dec. 30, 2019

(65) Prior Publication Data

US 2020/0135471 A1    Apr. 30, 2020

Related U.S. Application Data

(63) Continuation of application No. 16/117,234, filed on Aug. 30, 2018, now Pat. No. 10,535,523.

(51) Int. Cl.
*H01L 21/28*    (2006.01)
*H01L 29/49*    (2006.01)
(Continued)

(52) U.S. Cl.
CPC .. *H01L 21/28088* (2013.01); *H01L 21/28556* (2013.01); *H01L 21/32135* (2013.01); *H01L 29/4966* (2013.01)

(58) Field of Classification Search
CPC .......... H01L 21/28088; H01L 29/4966; H01L 21/32135; H01L 21/28556
See application file for complete search history.

(56) References Cited

U.S. PATENT DOCUMENTS 7,741,197 B1    6/2010  Duan et al.
10,535,523 B1*  1/2020  Lin .................. H01L 21/32135
(Continued)

FOREIGN PATENT DOCUMENTS

KR    20170015055 A    2/2017

OTHER PUBLICATIONS

Office Action, dated Sep. 17, 2020, for Korean Intellectual Property Office Appl. No. 10-2019-0103572, 8 pages.

*Primary Examiner* — Anthony Ho
(74) *Attorney, Agent, or Firm* — Sterne, Kessler, Goldstein & Fox P.L.L.C.

(57) ABSTRACT

The present disclosure relates to a semiconductor device and a manufacturing method of fabricating a semiconductor structure. The method includes forming an opening in a substrate and depositing a conformal metal layer in the opening. The depositing includes performing one or more deposition cycles. The deposition includes flowing a first precursor into a deposition chamber and purging the deposition chamber to remove at least a portion of the first precursor. The method also includes flowing a second precursor into the deposition chamber to form a sublayer of the conformal metal layer and purging the deposition chamber to remove at least a portion of the second precursor. The method further includes performing a metallic halide etching (Continued)

(MHE) process that includes flowing a third precursor into the deposition chamber.

20 Claims, 12 Drawing Sheets

(51) Int. Cl.
*H01L 21/3213* (2006.01)
*H01L 21/285* (2006.01)

(56) References Cited

U.S. PATENT DOCUMENTS

| | | |
|---|---|---|
| 2006/0097397 A1 | 5/2006 | Russell |
| 2017/0032972 A1 | 2/2017 | Tsai et al. |
| 2019/0096681 A1 | 3/2019 | Wei et al. |

* cited by examiner

FORMATION AND IN-SITU ETCHING PROCESSES FOR METAL LAYERS

This application is a continuation of U.S. Non-provisional patent application Ser. No. 16/117,234, titled "Formation and In-situ Etching Processes for Metal Layers," filed on Aug. 30, 2018, which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
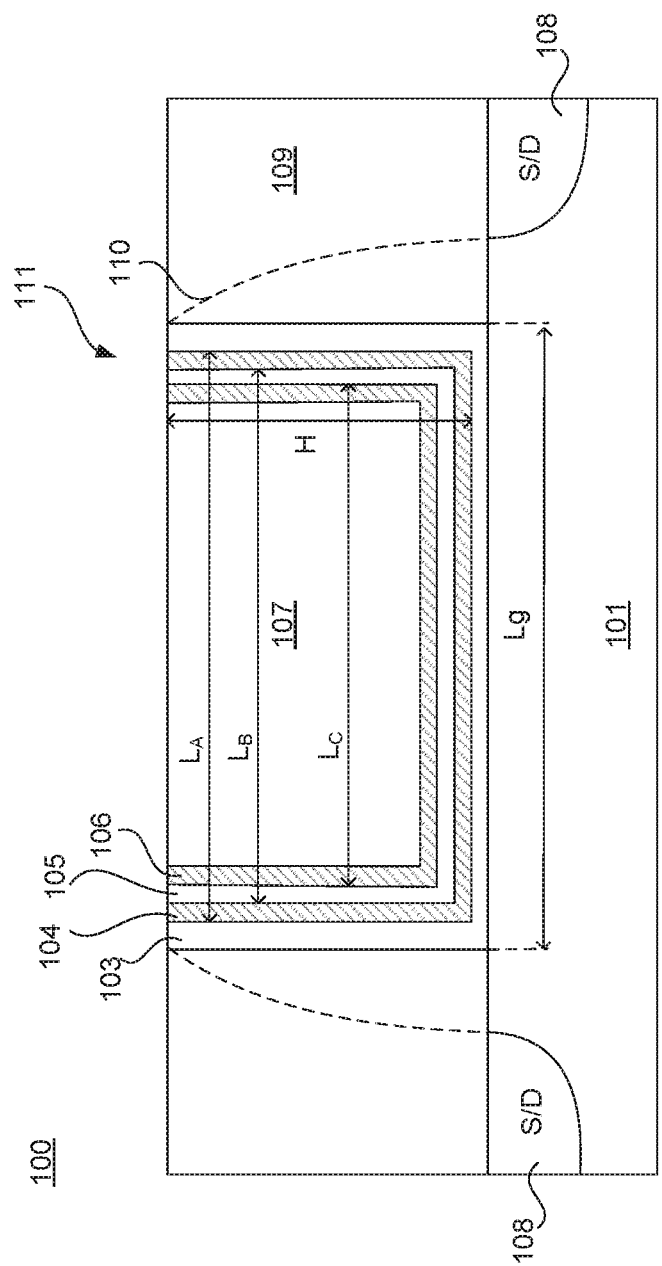
FIGS. 1-3B are views of semiconductor structures, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material may be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Replacement metal gate and high-k gate dielectrics are used in scaled planar and FinFET-based devices for improved circuit performance. For example, metal gate electrodes and high-k gate dielectric layers (i.e., gate dielectric layers having dielectric constant greater than 3.9) can respectively replace polysilicon gate electrodes and silicon dioxide dielectric layers to achieve reduced gate leakage and improved drive current. One process of implementing metal gates is termed a "gate last" or "replacement gate" process. Such processes include forming a sacrificial polysilicon gate, performing various processes associated with the semiconductor device, removing the sacrificial gate to form a trench or opening, and depositing metal gate material in the trench or opening to form a metal gate.

Metal electrode layers having appropriate work function values are used in the replacement gate process to provide a nominal transistor threshold voltage. To that end, a variety of metal electrode layers having a variety of work function values (e.g., near a conduction band-edge, near a valence band-edge, or near mid-gap) have been investigated for application in a variety of device types (e.g., 2D and/or 3D n-type/p-type FETs). Selection of work function materials for the metal gate affects transistor threshold voltage $V_{TH}$. A work function value is associated with the material composition of the work function layer, thus the material of the work function layer is chosen to tune its work function so that the desired nominal threshold voltage $V_{TH}$ is achieved. Work function metal may be p-type or n-type.

As technologies progress, integrated circuits are characterized by decreasing dimension requirements over previous generation devices. However, there are challenges to implement such features and processes; for example, decreased critical dimensions of a photolithography process can result in openings having a higher aspect ratio (i.e., depth to width ratio of the opening). As an example, such high aspect ratio openings can be formed during a metal gate replacement process after a sacrificial gate structure is removed and prior to depositing gap filling layers. During the deposition of gap filling layers, such as work function layers and metal source/drain contacts, high aspect ratios can be one of the reasons for pre-mature sealing and/or form defects in the gap fill material. Defects can include voids and poor step coverage, which can be discontinuities in the deposited material on sidewall or bottom surfaces of the gap. The defects and poor step coverage can in turn lead to poor device performance.

Atomic layer deposition (ALD) processes are developed from a variety of CVD processes to provide conformal thin film deposition. ALD processes feature sequential alternating exposure of chemical precursors that reacts with the substrate. In an ALD process, a first precursor is pulsed into a reaction chamber under vacuum for a predetermined amount of time to allow the first precursor to fully react with the substrate surface. Subsequently, the reaction chamber is purged with an inert gas to remove any unreacted precursor and reaction by-products. A second precursor is then pulsed into the reaction chamber to react with the reacted first precursor and form one or more atomic layers (collectively called "a sublayer") of the desired material. This process is then cycled until a nominal film thickness is achieved. Although ALD processes provide relatively conformal film deposition in a variety of structures and surfaces, for defects in high aspect ratio structures (e.g., greater than 6), such as voids, can still remain. For example, in high aspect ratio openings, the ALD process may deposit material faster at the top corners rather than the bottom of the opening, resulting in overhang at the top corners and may prematurely close the opening before the opening is completely filled.

Various embodiments in accordance with this disclosure provide methods of forming conformal metal layers with improved step coverage (e.g., substantially uniform and continuous coverage of material) in high aspect ratio openings (e.g., aspect ratios greater than 6). In some embodiments, the conformal layers formed using methods described in the present disclosure can include metal compound layers and metal layers; these layers are collectively described as "metal layers" for simplicity. The conformal metal layers can be formed using a multi-cycle deposition and in-situ etching process. The formation process can include cycles of deposition processes and in-situ etching processes, such as a metallic halide etching (MHE) process. An MHE process is a dry etching process using chlorine-based or fluorine-based precursors in a vacuum chamber. MHE processes can efficiently remove overhang at top corners of an opening due to higher reactant molecular density and large contact surface with reactant molecules at the top corners. The MHE process can be performed in-situ (e.g., performed in the same chamber as the multi-cycle deposition process) between or at the end of deposition cycles to etch away excessive deposited material and form a conformal metal layer. In some embodiments, the deposited metal layer can be substantially conformal. In some embodiments, the deposited material layer can provide substantially uniform and continuous material coverage on the sidewall, bottom, and top surfaces of high aspect ratio openings to achieve improved step coverage. In some embodiments, the multi-cycle deposition process can include an atomic layer deposition (ALD) process. In some embodiments, precursors used in the MHE process can include chlorine-based or fluorine-based metal precursors. Nominal thickness and quality of the conformal metal layers can be varied by adjusting at least the deposition conditions, number of deposition cycles, choice of precursors for the MHE process, number of etching cycles, parameters of the MHE process, other suitable parameters, and/or combinations thereof.

In accordance with various embodiments of this disclosure, using the deposition and in-situ etching process to form conformal gap fill layers in semiconductor structures provides, among other things, benefits of (i) high device reliability and threshold voltage performance due to improved step coverage in high aspect ratio structures; (ii) reduction or elimination of the need for additional dry etching or wet etching processes due to application of the MHE etching process; and (iii) reduction of contamination and cost by employing an in-situ etching process.

It is noted that the present disclosure presents embodiments directed to gate stack formation and related gate stack structures, which may be employed in multiple technology nodes and in a variety of device types. In some embodiments, the conformal metal layers and methods for forming the same can be incorporated in technology nodes of 7 nm or less. For example, embodiments described herein may also be applied in 3 nm technology nodes. In some embodiments, gate stacks can be suitable for use in planar bulk metal-oxide-semiconductor field-effect transistors (MOSFETs), multi-gate transistors (planar or vertical) such as FinFET devices, gate-all-around (GAA) devices, Omega-gate ($\Omega$-gate) devices, or Pi-gate ($\Pi$-gate) devices, as well as strained-semiconductor devices, silicon-on-insulator (SOI) devices, partially-depleted SOI devices, fully-depleted SOI devices, or other devices. In addition, embodiments disclosed herein may be employed in the formation of p-type and/or n-type devices. Other semiconductor structures may also benefit from embodiments of the present disclosure, such as contacts and interconnects.

It is also noted that the term "in-situ" is used to describe processes that are performed while a device or wafer remains within a processing system (e.g., including a load lock chamber, transfer chamber, processing chamber, or any other processing chamber), and where for example, the processing system allows the substrate to remain under vacuum conditions. As such, the term "in-situ" may also generally be used to refer to processes in which the device or substrate being processed is not exposed to an external ambient (e.g., external to the processing system).

FIGS. 1-4 illustrate metal layer fabrication processes in various semiconductor devices based on embodiments of the multi-step deposition and MHE process method. The fabrication process can produce conformal metal layers having improved step coverage (i.e., substantially uniform and continuous coverage of material) in high aspect ratio openings. Although fabrication processes of planar devices and multi-fin FinFET are described here as examples, the fabrication process can be applied in various semiconductor structures, such as trenches or gaps with low or high aspect ratios, single-fin FinFETs, and any other suitable semiconductor structure. The fabrication processes provided here are exemplary, and alternative processes in accordance with this disclosure may be performed that are not shown in these figures. Some embodiments of the present disclosure provide methods for manufacturing n-type and p-type devices using a replacement gate process. For example, fabrication processes of n-MOS and p-MOS devices are introduced.

FIG. 1 shows a cross-sectional view of a semiconductor device 100 incorporating metal gap fill layers, in accordance with some embodiments. In some embodiments, semiconductor device 100 is a planar n-MOS device. As discussed above, a replacement gate process includes forming an opening in an ILD layer after the sacrificial polysilicon is removed. As shown in FIG. 1, a gate trench 111 is formed between opposing surfaces of ILD 109 and a top surface of semiconductor substrate 101. In FIG. 1, an n-type work function layer 105, a blocking layer 106, and a metal layer 107 are collectively referred to herein as "a metal gate stack" and is positioned over a semiconductor substrate 101. In FIG. 1, a high-k dielectric layer 103 and a barrier layer 104 are lined between semiconductor substrate 101 and the metal gate stack. An optional spacer 110 is formed on sidewalls of the metal gate stack to facilitate a subsequent source/drain alignment operation.

As shown in FIG. 1, the metal gate stack, high-k dielectric layer 103 and optional spacer 110 are positioned within an interlayer dielectric (ILD) 109 in a lateral direction. In FIG. 1, a source/drain (S/D) 108 is formed in the semiconductor substrate 101, and a distance between the source and the drain is gate length $L_g$. In some embodiments, the gate length $L_g$ of semiconductor device 100 can be about 16 nm. In some embodiments, gate length $L_g$ can be less than 16 nm. In some embodiments, gate length Lg can be greater than 16 nm. Gate height H as measured from a bottom of barrier layer 104 to a top surface of metal layer 107 can be between about 10 nm and about 120 nm. In some embodiments, a distance $L_A$ between opposing sidewall surfaces of high-k dielectric layer 103 can be between about 10 nm and about 20 nm. In some embodiments, a distance $L_B$ between opposing sidewall surfaces of barrier layer 104 can be about 17 nm. In some embodiments, a distance $L_C$ between opposing sidewall surfaces of n-type work function layer 105 can be about 2 nm. In some embodiments, a p-MOS device can have a p-type work function layer lined between barrier layer 104 and n-type work function layer 105. In such cases, a distance between opposing sidewall surfaces of p-type work function layer can be about 8 nm.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and/or combinations thereof. In some embodiments, various layers can be formed on semiconductor substrate 101, such as dielectric layers, doped layers, polysilicon layers, conductive layers, other suitable layers, and/or combinations thereof. In some embodiments, various devices can be formed on semiconductor substrate 101, such as transistors, resistors, capacitors, other suitable devices, and/or combinations thereof.

High-k dielectric layer 103 can be any suitable material having dielectric constant greater than 3.9. For example, high-k dielectric layer 103 can include a high-k dielectric such as hafnium oxide ($HfO_x$). In some embodiments, high-k dielectric layer 103 can include other high-k dielectrics, such as lanthanum oxide (LaO), aluminum oxide ($Al_2O_3$), zirconium oxide (ZrO), titanium oxide (TiO), tantalum oxide ($Ta_2O_5$), yttrium oxide ($Y_2O_3$), strontium titanate (STO), barium titanate (BTO), hafnium silicate (HfSiO), silicon nitride ($Si_3N_4$), oxynitrides, any other suitable materials, and/or combinations thereof. High-k dielectric layer 103 can be formed by any suitable process such as ALD, chemical vapor deposition (CVD), metalorganic CVD (MOCVD), physical vapor deposition (PVD), plasma enhanced CVD (PECVD), plasma enhance ALD (PEALD), thermal oxidation, any other suitable deposition techniques, and/or combinations thereof. In some embodiments, high-k dielectric layer 103 can have a thickness between about 10 Å and about 20 Å.

Barrier layer 104 can formed over the high-k dielectric layer 103, in accordance with some embodiments. Barrier layer 104 can function as a barrier to protect high-k dielectric layer 103 by preventing metal diffusion. In some embodiments, barrier layer 104 can include titanium nitride (TiN), tantalum nitride (TaN), any other suitable barrier layer material, and/or combinations thereof. Barrier layer 104 can be formed after high-k dielectric layer 103 and formed using various deposition techniques such as ALD, PVD, CVD, PECVD, other suitable deposition processes, and/or combinations thereof. In some embodiments, barrier layer 104 can have a substantially uniform thickness between about 10 Å and about 30 Å.

In some embodiments, an MHE process can be used with an ALD deposition process to form a conformal barrier layer 104 having improved step coverage. In some embodiments, MHE processes can be used with other suitable deposition processes to provide improved step coverage. In some embodiments, an ALD process used to produce a barrier layer containing TiN can include pulsing a first precursor of ammonia ($NH_3$) into a reaction chamber under vacuum for a predetermined amount of time to allow the $NH_3$ to fully react with the substrate surface. Subsequently, a first purging process using an inert gas such as nitrogen or argon is performed in the reaction chamber to remove any unreacted $NH_3$ and reaction by-products. A second precursor of titanium tetrachloride ($TiCl_4$) is then pulsed into the reaction chamber to allow surface reaction with the first precursor and form one or more atomic layers of TiN. In some embodiments, pentakis-dimethylamino tantalum (PDMAT) can be used as the second precursor. A second purging process is performed in the reaction chamber to remove any unreacted $TiCl_4$ and any reaction by-products. For simplicity purposes, a single deposition cycle can be defined as including the above-described two pulsing and two purging processes. This deposition cycle is then repeated until a nominal film thickness of TiN is achieved. In some embodiments, MHE processes can be performed after one or more deposition cycles such that overhang can be reduced before a subsequent deposition cycle begins. For example, an MHE process can be performed after the two pulsing and two purging processes, in accordance with some embodiments. The MHE process can also be performed in intervals after a certain number of deposition cycles. In some embodiments, MHE processes can be performed after a final nominal film thickness is achieved and prior to the deposition process of a different material. The MHE process can efficiently remove overhang formed during the deposition cycle due to greater reactant molecular density at the top of the openings as compared to the bottom surface of the openings.

In some embodiments, the chlorine-based or fluorine-based metal precursor for the MHE process can include tungsten fluoride ($WF_x$), tungsten chloride ($WCl_x$), titanium chloride ($TiCl_x$), titanium fluoride ($TiF_x$), tantalum chloride ($TaCl_x$), where 'x' can be between about 1 and about 6. Any other suitable precursors can be used. The deposition cycle and the MHE process can be performed in-situ, for example, performed within a processing system such as an ALD cluster tool. The MHE process can be performed at a temperature between about 200° C. to about 1000° C. The precursors of the MHE process can be pulsed into the reaction chamber at a flow rate of about 100-12000 standard cubic centimeters per minute (sccm). The processing pressure for the MHE process can be between about 1 Torr and about 20 Torr. The MHE process can be performed for a period of time between about 10 s and about 300 s. In some embodiments, plasma is not activated during the MHE process. In some embodiments, the MHE processes between deposition cycles can be performed for substantially the same amount of time. In some embodiments, the MHE processing time can be different between deposition cycles. The processing conditions (e.g., including selection of the chlorine-based or fluorine-based metal precursors, deposition and MHE processing temperatures, and flow rates of the chlorine-based or fluorine-based metal precursor) can be selected so as to induce a thermal chemical reaction between the precursors and the MHE process, such that as a result of the etching process, excessive material at the top corners of the opening is removed and improved step coverage is achieved. In some embodiments, metal residual of the precursor used in the MHE process can remain within the deposited film. In some embodiments, the metal element of the chlorine-based or fluorine-based metal precursor can remain in the formed material after each MHE process. For example, W, Ta, or Ti residue can remain in the formed barrier layer 104. After each MHE process, metal residue can remain on the surface of the etched film. During the process where the MHE process is performed in-situ between deposition cycles and before a final film thickness is reached, the residual metal element may be embedded throughout the thickness of the final film, depending on the frequency and etch duration of the MHE process. For example, the residual metal element may be embedded at a depth between 10% and 90% of the thickness of the deposited film. In some embodiments, the MHE process is performed in-situ after each deposition cycle until a nominal final thickness is reached, and the residual metal element is formed throughout the thickness of the deposited film. In some embodiments, the MHE process is performed in-situ during a portion of the total deposition cycles. For example, the MHE process can be performed during the first 10% of the deposition cycles of the total deposition cycles. In such scenarios, the residual metal element may be embedded between 0% to 10% thickness of the final deposited film. It should be noted that residual metal element can be formed at the interface during deposition cycles where the MHE process has been applied, therefore the residual metal element can be formed at any suitable thickness of the deposited film. In some embodiments, the MHE process is performed in-situ after a final film thickness has been achieved. In such scenarios, the residual metal element may penetrate from the exposed surface of the final film into the film by a penetration depth. For example, the residual metal element may penetrate up to about 10% thickness from the surface of the final film, according to some embodiments. In some embodiments, the metal residual can be formed of metal elements used in the chlorine-based and fluorine-based metal precursors.

N-type work function layer 105 is deposited on barrier layer 104, in accordance with some embodiments. N-type work function layer 105 provides an appropriate work function value to achieve a nominal transistor threshold voltage for semiconductor device 100. In some embodiments, semiconductor device 100 can include one or more work function layers to achieve the nominal threshold voltage. A conformal work function layer with improved step coverage can provide high device reliability and threshold voltage performance. In some embodiments, n-type work function layer 105 can include aluminum-doped titanium carbide (TiAlC), aluminum-doped tantalum carbide (TaAlC), tantalum silicon carbide (TiSiC), any other suitable n-type work function layer material, and/or combinations thereof. N-type work function layer 105 can be formed after barrier layer 104 and formed using various deposition techniques such as ALD, PVD, CVD, PECVD, other suitable deposition processes, and/or combinations thereof. In some embodiments, n-type work function layer 105 can have a substantially uniform thickness between about 10 Å and about 50 Å.

In some embodiments, an MHE process can be used with an ALD deposition process to form a conformal n-type work function layer 105 having improved step coverage. In some embodiments, the MHE process can be used with other suitable deposition processes such as CVD or PVD to provide improved step coverage. In some embodiments, an ALD process used to produce an n-type work function layer containing TiAlC can include flowing a first precursor of $TiCl_4$ into a reaction chamber under vacuum for a predetermined amount of time to allow the first precursor to fully react with the substrate surface. Subsequently, a first purging process using an inert gas, such as nitrogen or argon, is performed in the reaction chamber to remove any unreacted $TiCl_4$ and reaction by-products. A second precursor such as triethylaluminum (TEA) is then flowed into the reaction chamber to allow a surface reaction with the first precursor and form one or more atomic layers of TiAlC. A second purging process is performed in the reaction chamber to remove any unreacted TEA and any reaction by-products. The deposition cycle is then repeated until a nominal film thickness of TiAlC is achieved.

In some embodiments, the MHE process can be performed after one or more deposition cycles such that overhang can be reduced before the subsequent deposition cycle begins. For example, the MHE process can be performed after each deposition cycle, in accordance with some embodiments. The MHE process can also be performed in intervals after a certain number of deposition cycles. In some embodiments, MHE processes can be performed after a final nominal film thickness is achieved and prior to the deposition process of a different material. The MHE process can efficiently remove overhang formed during the deposition cycle due to greater ion density at the top of the openings (e.g., trenches or vias) compared to the bottom surface of the openings.

In some embodiments, the chlorine-based or fluorine-based metal precursor for an MHE process can include tungsten chloride ($WCl_x$), tin chloride ($SnCl_x$), niobium chloride ($NbCl_x$), molybdenum chloride ($MoCl_x$), titanium fluoride ($TiF_x$), where 'x' can be between about 1 and about 6. In some embodiments, any other suitable precursors can be used. The deposition cycle and the MHE process can be performed in-situ. In some embodiments, the metal element of the chlorine-based or fluorine-based metal precursor can remain in the formed material. For example, W, Sn, Nb, Mo, or Ti atoms can remain in the formed n-type work function layer 105. In some embodiments, the processing conditions of the MHE process can be similar to the processing conditions used in the MHE process during the formation of barrier layer 104. For example, processing conditions such as temperature, precursor flow rates, chamber pressure, processing time, plasma condition, number of cycles, sequence of cycles, and other processing conditions can be similar between the aforementioned MHE processes. In some embodiments, the processing conditions can be different.

As discussed above, FIG. 1 illustrates semiconductor device 100 as a planar n-MOS device. In some embodiments, semiconductor device 100 can also be a planar p-MOS device. A p-MOS device may include a p-type work function layer formed prior to the deposition of n-type work function layer 105 and is not shown in FIG. 1 for simplicity. In some embodiments, the p-type work function layer can be formed after the deposition of n-type work function layer 105 and before forming blocking layer 106. A p-type work function material deposition process combined with an in-situ MHE process can also provide conformal p-type work function material deposition and improved step coverage.

The combined n-type and p-type work function layers can provide an appropriate work function value to achieve a nominal transistor threshold voltage for p-MOS devices. In some embodiments, the p-MOS device can include more than two work function layers to achieve a nominal threshold voltage. In some embodiments, p-type work function layer can include TiN, high-k capping TiN, any other suitable work function layer material, and/or combinations thereof. A p-type work function layer can be formed after an n-type work function layer and can be formed using various deposition techniques, such as ALD, PVD, CVD, PECVD, other suitable deposition processes, and/or combinations thereof. In some embodiments, the metal element of the chlorine-based or fluorine-based metal precursor can remain in the formed material. In some embodiments, p-type work function layer can have a substantially uniform thickness between about 5 Å and about 50 Å. The MHE process for forming the p-type work function layer can include precursors using $WCl_x$, $TaCl_x$, $SnCl_x$, $NbCl_x$, where 'x' can be between about 1 and about 6. In some embodiments, any other suitable precursors can be used. In some embodiments, the processing conditions of the MHE process in a p-type work function layer formation process can be similar to those in the formation process of n-type work function layer 105. In some embodiments, the processing conditions can be different.

Blocking layer 106 can be formed on n-type work function layer 105, in accordance with some embodiments. Blocking layer 106 may be formed on a p-type work function layer, in accordance with some embodiments. Blocking layer 106 can be formed on the work function layers in an in-situ manner, preventing the underlying work function layer from contamination or oxidation. Blocking layer 106 can include TiN, TaN, TSN, any other suitable material, and/or combinations thereof. In some embodiments, blocking layer 106 can have a thickness ranging from about 5 Å to about 40 Å. Blocking layer 106 can be formed by various deposition techniques, such as ALD, PVD, CVD, PECVD, or any other suitable techniques. In some embodiments, blocking layer 106 can be an optional layer that can be removed.

Similar to the deposition process of barrier layer and work function layers, a blocking layer deposition process combined with an in-situ MHE process can also provide conformal blocking material deposition and improved step coverage. In some embodiments, the MHE process for forming blocking layer 106 can include precursors, such as $WCl_x$, $SnCl_x$, $NbCl_x$, $MoCl_x$, $TiF_x$, where 'x' can be between about 1 and about 6. Any other suitable precursors can be used. In some embodiments, the metal element of the chlorine-based or fluorine-based metal precursor can remain in the formed material. For example, W, Sn, Nb, Mo, or Ti atoms can remain in the formed blocking layer 106. In some embodiments, the processing conditions of the MHE process in a blocking layer formation process can be similar to those in the formation process of n-type work function layer 105. The processing conditions can be different.

In some embodiments of the present disclosure, metal layer 107 is formed to fill in a remainder of a gate trench in the metal gate stack. Metal layer 107 can include any metal material suitable for forming a metal gate or portion thereof. For example, metal layer 107 can include tungsten. In some embodiments, metal layer 107 can be formed using tungsten nitride (WN), TaN, ruthenium, silver, aluminum, any other suitable material, and/or combinations thereof. In some embodiments, metal layer 107 can be formed using a damascene process followed by a planarization process (e.g., a chemical mechanical polishing process) to remove any excessive material formed on the top surface of ILD 109.

In some embodiments, ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. ILD 109 can be planarized by a chemical-mechanical-polishing process until a top portion of the metal gate stack is exposed as illustrated in FIG. 1. The CMP process includes a high selectivity to provide a substantially planar surface for the metal gate stack, spacers 110, and ILD 109. In some embodiments, the CMP process has low dishing and/or metal erosion effect.

In some embodiments, in addition to the layers described above, semiconductor device 100 may further include liner layers, interfacial layer, seed layers, adhesion layers, barrier layers, or their equivalents.

Figure 2:
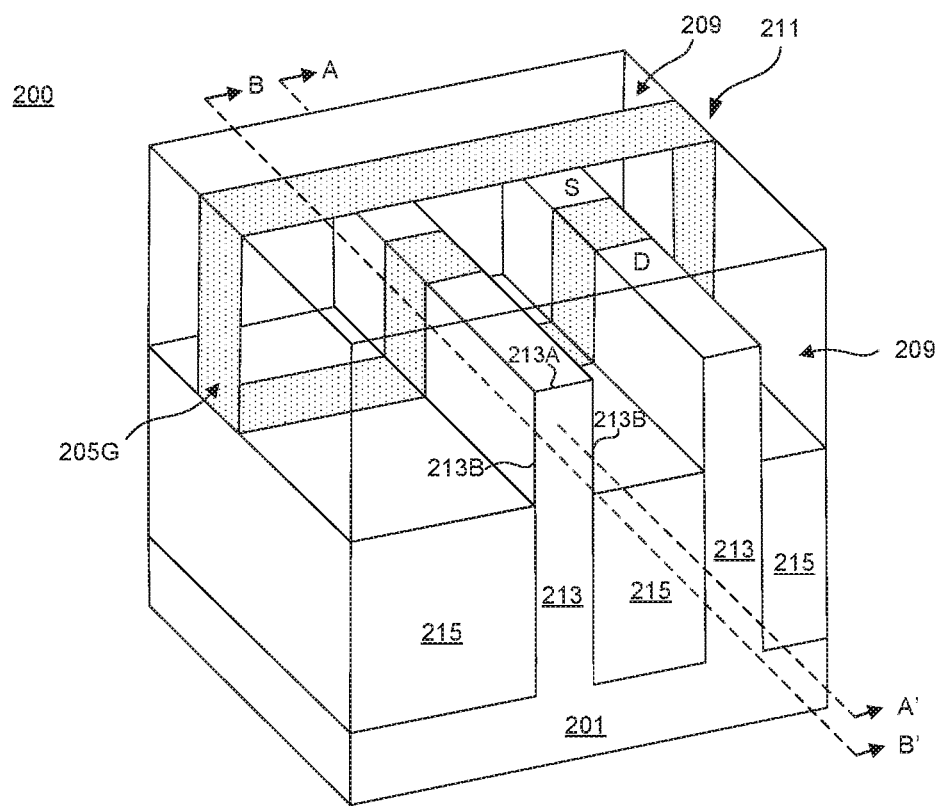
Figure 3A:
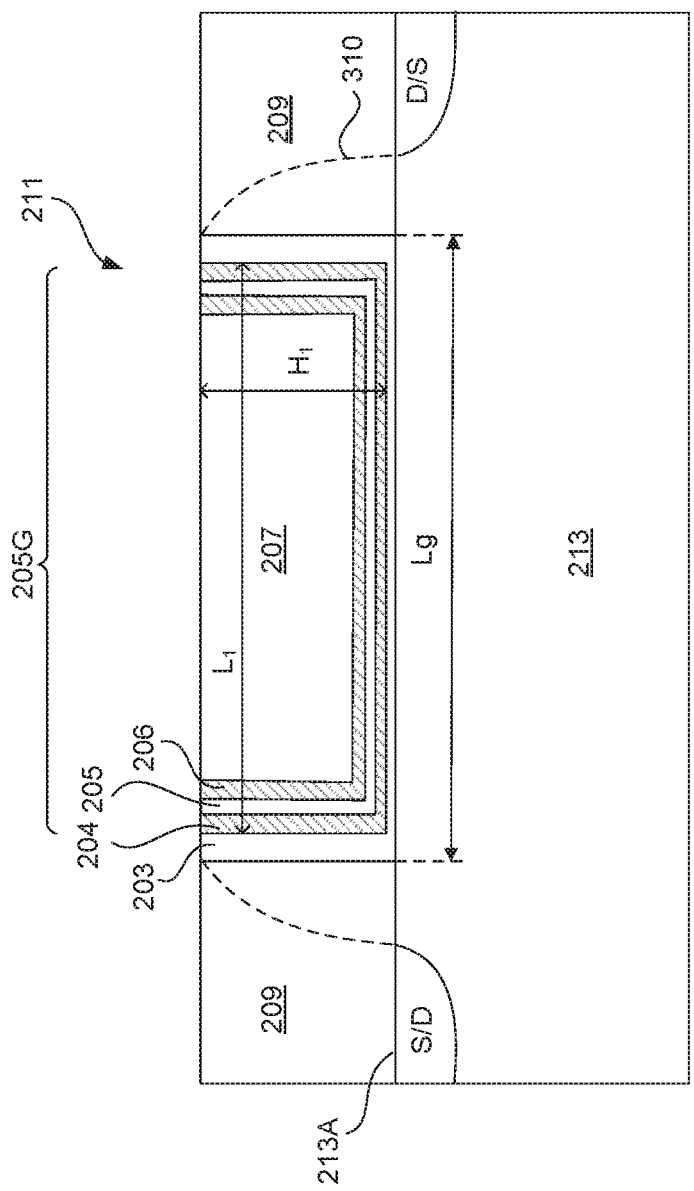
Figure 3B:
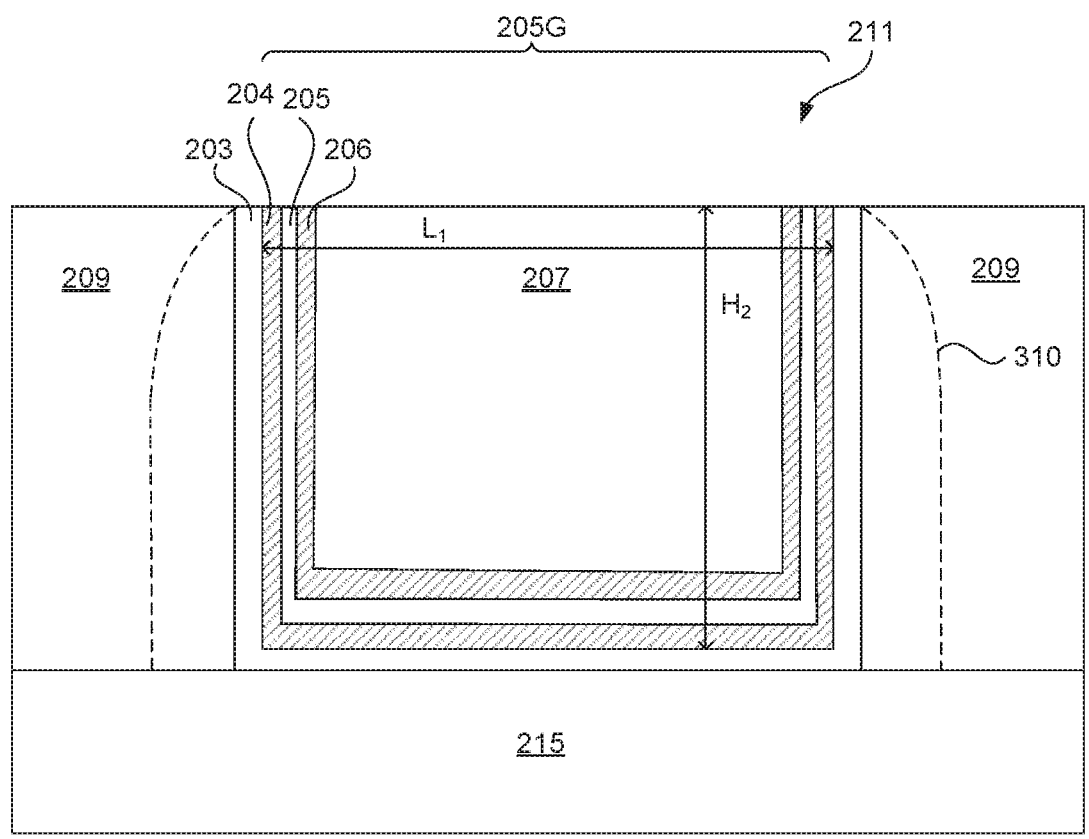

FIGS. 2-3B illustrate various views of a metal gate FinFET structure 200. As shown in FIGS. 3A and 3B, metal gate FinFET structure 200 can include barrier layers, work function layers, and blocking layers formed in high aspect ratio openings using the multi-cycle deposition and MHE etching process (described above) to produce a conformal film deposition with improved step coverage. As an example, metal gate FinFET structure 200 illustrated in the present disclosure can be an n-type FinFET having one or more n-type work function layers. It should be noted that metal gate FinFET structure 200 can also include a p-type FinFET with one or more n-type and p-type work function layers formed using the multi-cycle deposition and MHE processes to provide conformal film thickness and improved step coverage.

Referring to FIG. 2, a perspective view of metal gate FinFET structure 200 is shown. Two semiconductor fins 213 are positioned on a substrate 201 and are separated by shallow trench isolation 215. Semiconductor fin 213 can be formed of silicon, silicon-germanium, germanium, or other suitable semiconductor materials. A metal gate 205G is formed over top surface 213A and sidewalls 213B of semiconductor fins 213. A channel of FinFET structure 200 (not shown) is defined along top surface 213A and sidewalls 213B of semiconductor fin 213 and extended between source/drain (S and D) in the semiconductor fin 213. As shown in FIG. 2, ILD 209 is formed over top surface 213A and sidewalls 213B at the S/D portions of the semiconductor fins 213. Shallow trench isolation 215 is formed on substrate 201 and between adjacent semiconductor fins 213. Metal gate can be formed using a replacement gate process where a sacrificial polysilicon gate structure is removed from ILD 209, leaving an opening where a metal gate structure can be deposited. In some embodiments, the opening can be a high aspect ratio opening having an aspect ratio between about 6 and about 60.

Semiconductor substrate 201 can be a bulk semiconductor substrate on which various layers and device structures are formed. In some embodiments, semiconductor substrate 201 can be similar to semiconductor substrate 101 as described above in FIG. 1 and is not repeated here for simplicity. In some embodiments, semiconductor substrate 201 can be different from semiconductor substrate 101. In some embodiments, various layers and devices can be formed on semiconductor substrate 201. For example, dielectric layers, doped layers, polysilicon layers, conductive layers, other suitable layers, and/or combinations thereof. Multiple devices can be interconnected through an interconnect layer to additional integrated circuits.

Referring to FIG. 3A and FIG. 3B, two cross-sectional views of metal gate FinFET structure 200 are shown. The cross section shown in FIG. 3A is viewed from a first direction of metal gate FinFET structure 200 of FIG. 2. The first direction is cut through semiconductor fin 213 and parallel to a longitudinal axis of semiconductor fin 213 and is denoted as "A-A'." The cross section shown in FIG. 3B is viewed from a second direction of metal gate FinFET structure 200 of FIG. 2. The second direction is through shallow trench isolation 215 and also parallel to a longitudinal axis of semiconductor fin 213 and is denoted as "B-B'." Gate trench 211 is formed between opposing surfaces of ILD 209 and top surface 213A of semiconductor fin 213 as shown in FIG. 3A or between opposing surfaces of ILD 209 and top surface of shallow trench isolation 215 as shown in FIG. 3B. An optional spacer 310 is formed on sidewalls of the metal gate stack to facilitate a subsequent source/drain alignment operation. Spacer 310 can be similar to spacer 110 described above in FIG. 1 and is not described in detail here for simplicity.

In FIG. 3A, metal gate stack 205G is positioned on semiconductor fin 213 and in gate trench 211. Metal gate stack 205G can include barrier layer 204, n-type work function layer 205, blocking layer 206, and metal layer 207. A channel length $L_g$ is measured along top surface 213A of semiconductor fin 213 and extended between a source (S) and a drain (D) in semiconductor fin 213. In some embodiments, the channel length $L_g$ in metal gate FinFET structure 200 is less than about 16 nm. In some embodiments, the channel length $L_g$ can be greater than about 16 nm. A height $H_1$ of metal gate stack 205G is a length measured from a leveled top surface of metal layer 207 to a bottom surface of barrier layer 204. In some embodiments, the height $H_1$ of metal gate stack 205G can be from about 20 nm to about 120 nm. A distance $L_1$ between opposing surfaces of high-k dielectric layer 203 can be between about 10 nm and about 20 nm. In some embodiments, an aspect ratio of metal gate stack 205G can be in a range of from about 6 to about 12. The aspect ratio of metal gate stack 205G refers to a ratio of height $H_1$ over distance $L_1$. The greater the aspect ratio of the gate trench, the greater the difficulty of depositing substantially uniform films with improved step coverage. In some embodiments, a distance between opposing surfaces of barrier layer 204 can be about 17 nm. In some embodiments, a distance between opposing surfaces of n-type work function layer 205 can be about 2 nm. In some embodiments, a p-type FinFET structure can have a p-type work function layer lined between barrier layer 204 and n-type work function layer 205. In such cases, a distance between opposing surfaces of p-type work function layer can be about 8 nm.

High-k dielectric layer 203 can be any suitable material having dielectric constant greater than 3.9. High-k dielectric layer 203 can be similar to high-k dielectric layer 103 described above in FIG. 1 and is not described in detail here for simplicity. In some embodiments, high-k dielectric layer 203 can include a high-k dielectric, such as hafnium oxide ($HfO_x$). High-k dielectric layer 203 can be formed using a similar process used to form high-k dielectric layer 103. In some embodiments, high-k dielectric layer 203 can be formed using a different deposition process. In some embodiments, high-k dielectric layer 203 can have a thickness between about 10 Å and about 20 Å.

Barrier layer 204 can be formed over high-k dielectric layer 203, in accordance with some embodiments. Barrier layer 204 can be similar to barrier layer 104 as described above in FIG. 1 and is not described in detail here for simplicity. In some embodiments, barrier layer 204 can include TiN, TaN, any other suitable barrier layer material, and/or combinations thereof. Barrier layer 204 can be formed after high-k dielectric layer 203 and formed using various deposition techniques, such as ALD, PVD, CVD, PECVD, other suitable deposition processes, and/or combinations thereof. In some embodiments, barrier layer 204 can have a substantially uniform thickness between about 10 Å and about 30 Å. Similar to forming barrier layer 104, an MHE process can be used with an ALD deposition process to form a conformal barrier layer 204 having improved step coverage. In some embodiments, the MHE process for forming barrier layer 204 can be similar to the MHE process for forming barrier layer 104 and is not described in detail here for simplicity. In some embodiments, the deposition or MHE processes can be different.

N-type work function layer 205 is deposited on barrier layer 104, in accordance with some embodiments. N-type work function layer 205 can be similar to n-type work function layer 105 described above in FIG. 1 and is not described in detail here for simplicity. In some embodiments, n-type work function layer 205 can include TiAlC, TaAlC, TiSiC, any other suitable barrier layer material, and/or combinations thereof. N-type work function layer 205 can be formed using various deposition techniques, such as ALD, PVD, CVD, PECVD, other suitable deposition processes, and/or combinations thereof. N-type work function layer 205 can have a substantially uniform thickness between about 10 Å and about 50 Å. In some embodiments, an MHE process can be used with an ALD deposition process to form a conformal n-type work function layer 205 having improved step coverage. In some embodiments, deposition processes and MHE processes used to form n-type work function layer 205 can be similar to the corresponding processes used to form n-type work function layer 105 and are not described in detail here for simplicity.

Although FIG. 3A illustrates metal gate FinFET structure 200 as an n-type device, metal gate FinFET structure 200 can also include a p-type device. The p-type device can include a p-type work function layer formed prior to the deposition of n-type work function layer 205 and is not shown in FIG. 3A for simplicity. A p-type work function material deposition process combined with an in-situ MHE process can also provide conformal p-type work function material deposition and improved step coverage. The formation of such p-type work function layer can be similar to the p-type work function layer described above with reference to FIG. 1 and is not described here in detail for simplicity.

Blocking layer 206 can be formed on n-type work function layer 205, in accordance with some embodiments. Blocking layer 206 can also be formed on a p-type work function layer in a p-type FinFET, in accordance with some embodiments. Blocking layer 206 can be formed using a similar deposition and MHE process as blocking layer 106 described above in FIG. 1 and is not described in detail here for simplicity. In some embodiments, the processing conditions can be different. In some embodiments, the blocking layer 206 is an optional layer.

Metal layer 207 can be formed to fill in a remainder of a gate trench in metal gate stack 205G. Metal layer 207 can be similar to metal layer 107 as described above in FIG. 1 and is not described here in detail for simplicity. In some embodiments, metal layer 207 can include tungsten. In some embodiments, metal layer 207 can be formed using WN, TaN, ruthenium, silver, aluminum, any other suitable material, and/or combinations thereof. In some embodiments, metal layer 207 can be formed using a damascene process followed by a planarization process to remove any excessive material formed on the top surface of ILD 209.

In some embodiments, ILD 209 can include a dielectric material. In some embodiments, ILD 209 can be similar to ILD 109 as described above in FIG. 1 and is not described in detail here for simplicity. ILD 209 can be planarized by a chemical mechanical polishing process until a top portion of metal gate stack 205G is exposed as illustrated in FIG. 3A.

The cross section shown in FIG. 3B is cut from a second direction shown in FIG. 2. The second direction is cut through shallow trench isolation 215 and in parallel to a longitudinal axis of semiconductor fin 213 and is denoted as "B-B'." Elements with the same numeral labels in FIGS. 2, 3A, and 3B are directed to the same structure of materials and are not repeated here for simplicity. Shallow trench isolation 215 can be used to provide electrical insulation between adjacent devices and can be formed using low-k dielectric material (e.g., dielectric material having dielectric constant lower than 3.9). A gate height $H_2$ in FIG. 3B is measured from a top surface of metal layer 207 to a bottom surface of barrier layer 204. Gate height $H_2$ can be greater than gate height $H_1$ of FIG. 3A because gate height $H_2$ includes the height of both gate height H1 and also thickness of ILD 209 that is between top surface 213A of semiconductor fin 213 and top surface of metal layer 207. Therefore, the gate trench formed in ILD 209 as viewed in FIG. 3B during the gate replacement process can have a higher aspect ratio than the gate trench in FIG. 3A. For example, the aspect ratio can be between about 6 and about 60. In some embodiments, the height $H_2$ of the metal gate stack can be from about 120 nm to about 600 nm. A distance $L_1$ between opposing surfaces of high-k dielectric layer 203 can be between about 10 nm and about 20 nm. As described above, the multi-cycle deposition process and NINE process can produce conformal film with improved step coverage in high aspect ratio openings, such as the opening formed during the gate replacement structure illustrated in FIG. 3B.

Figure 4:
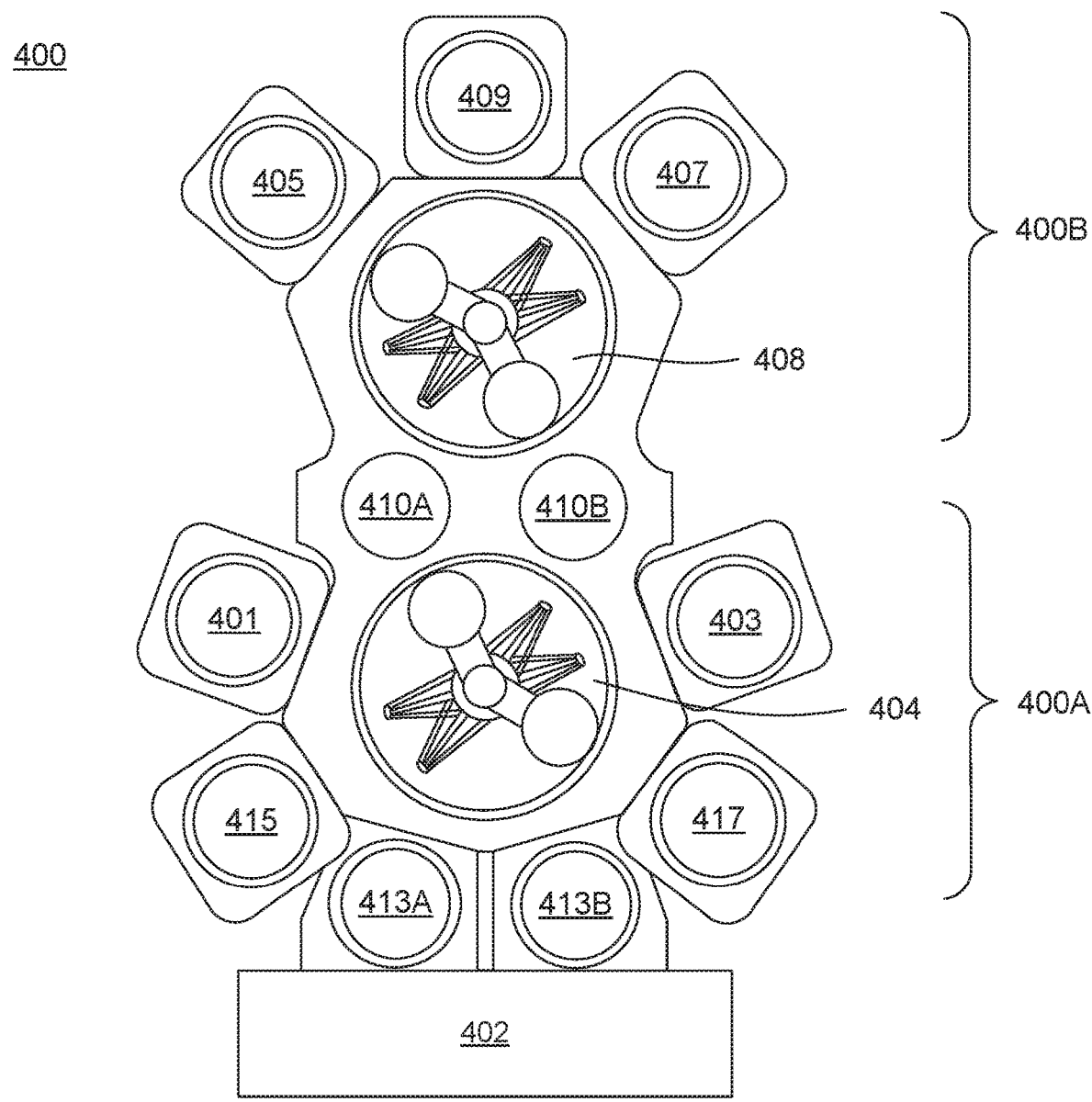
FIG. 4 is a configuration of a semiconductor wafer manufacturing system, in accordance with some embodiments.

Referring to FIG. 4, a configuration of a semiconductor wafer manufacturing system 400 used to form the work function layers in a metal gate semiconductor device is illustrated. The semiconductor wafer manufacturing system 400 has several growth chambers arranged in each of the two clusters 400A and 400B. Semiconductor wafer manufacturing system 400 may also include other growth chambers for depositing dielectric layers, barrier layers, blocking layers, adhesion layers, anti-reflecting layers, and any other suitable layers. Each layer in the metal gate structures described above in FIGS. 1-3B can be formed in semiconductor wafer manufacturing system 400 without exposing the wafer to ambient contact between deposition processes.

Two load lock chambers 413A and 413B are configured to receive a wafer transferred from a load port 402. Load lock chambers 413A and 413B are vented to a pressure equivalent to the load port 402 while a wafer is transferred between load port 402 and load lock chambers 413A or 413B. When moving the wafer from load lock chamber 413A or 413B into one of the chambers in semiconductor wafer manufacturing system 400, load lock chambers 413A and 413B are pumped down to a certain degree of vacuum that is closer to the vacuum level inside the clusters 400A and 400B. Clusters 400A and 400B each has at least one mechanical means such as a robot arm 404 or 408 which transfers the wafer parked in the pumped-down load lock chamber 413A or 413B to one of the growth chambers. Semiconductor wafer manufacturing system 400 can also include degassing chambers 415 and 417 that are used to activate and remove gaseous and/or liquid substances, such as moisture and oxygen from substrates to prevent change in thin film characteristics and cause deposition failure.

In some embodiments, a dielectric deposition chamber 401 is attached to cluster 400A and is loaded with precursors for high-k dielectric growth. For example, to deposit high-k dielectric layers 103 and 203 as illustrated in FIGS. 1 and 2 respectively, precursors such as hafnium tetrachloride ($HfCl_4$), water ($H_2O$), and any other suitable precursors are provided to deposition chamber 401.

In some embodiments, a barrier layer deposition chamber 403 is attached to cluster 400A and is connected to precursor supplies for barrier layer growth. For example, deposition chamber 403 can be loaded with precursors for multi-cycle deposition and MHE processes used to form conformal barrier layers with improved step coverage. The precursors can be in a gas form. Deposition chamber 403 can be operated with or without activated plasma during the MHE process. In some embodiments, deposition chamber 403 can be an ALD deposition chamber that can also perform in-situ MHE processes. In some embodiments, deposition chamber 403 can be maintained at a temperature between room temperature and about 200° C. In some embodiments, deposition chamber 403 can be maintained at a temperature between about 200° C. and about 1000° C. In some embodiments, deposition chamber 403 can be maintained at a chamber pressure between about 1 Torr and about 20 Torr during an MHE process. In some embodiments, barrier layer deposition chamber 403 can be connected to supplies for precursors, such as $WCl_x$, $WF_x$, $TaCl_x$, $TiCl_x$, $NH_3$, PDMAT, and/or any other suitable precursors, where 'x' can be between about 1 and about 6.

In some embodiments, an n-type work function layer deposition chamber 405 is attached to cluster 400B and is connected to precursor supplies for n-type work function layer deposition. For example, deposition chamber 405 can be loaded with precursors for multi-cycle deposition and MHE processes used to form n-type work function layers. In some embodiments, the precursors can be in gas form. In some embodiments, deposition chamber 405 can be an ALD deposition chamber that can also perform in-situ MHE processes. In some embodiments, deposition chamber 405 can be maintained at a temperature between room temperature and about 200° C. In some embodiments, deposition chamber 405 can be maintained at a temperature between about 200° C. and about 1000° C. In some embodiments, deposition chamber 405 can be maintained at a chamber pressure between about 1 Torr and about 20 Torr during an MHE process. In some embodiments, n-type work function layer deposition chamber 405 can be connected to supplies for precursors, such as $WCl_x$, $SnCl_x$, $NbCl_x$, $MoCl_x$, TEA, and/or any other suitable precursors, where 'x' can be between about 1 and about 6.

In some embodiments, a p-type work function layer deposition chamber 407 is attached to cluster 400B and is connected to precursor supplies for p-type work function layer deposition. For example, deposition chamber 407 can be loaded with precursors for multi-cycle deposition and MHE processes used to form p-type work function layers. In some embodiments, deposition chamber 407 can be an ALD deposition chamber that can also perform in-situ MHE processes. In some embodiments, deposition chamber 407 can be maintained at a temperature between room temperature and about 200° C. In some embodiments, deposition chamber 407 can be maintained at a temperature between about 200° C. and about 1000° C. In some embodiments, deposition chamber 407 can be maintained at a chamber pressure between about 1 Torr and about 20 Torr during an MHE process. In some embodiments, n-type work function layer deposition chamber 407 can be connected to supplies for precursors, such as $WCl_x$, $SnCl_x$, $NbCl_x$, $MoCl_x$, TEA, and/or any other suitable precursors, where 'x' can be between about 1 and about 6.

In some embodiments, a blocking layer deposition chamber 409 is attached to cluster 400B and is connected to precursor supplies for blocking layer deposition. For example, deposition chamber 409 can be loaded with precursors for multi-cycle deposition and MHE processes used to form p-type work function layers. In some embodiments, deposition chamber 409 can be an ALD deposition chamber that can also perform in-situ MHE processes. In some embodiments, deposition chamber 409 can be maintained at a temperature between room temperature and about 200° C. In some embodiments, deposition chamber 409 can be maintained at a temperature between about 200° C. and about 1000° C. In some embodiments, deposition chamber 409 can be maintained at a chamber pressure between about 1 Torr and about 20 Torr during an MHE process. In some embodiments, n-type work function layer deposition chamber 409 can be connected to supplies for precursors, such as $WCl_x$, $SnCl_x$, $NbCl_x$, $MoCl_x$, $TiCl_x$, and/or any other suitable precursors, where 'x' can be between about 1 and about 6.

In some embodiments, cooling chambers 410A and 410B allow a wafer to cool down to a desired temperature at an appropriate cooling rate in between various thin film growths without ambient contact. In some embodiments, additional chambers can be included in semiconductor wafer manufacturing system 400 for depositing any suitable material used to form the semiconductor structures described above in FIGS. 1-3B. For example, metal layer deposition chambers can be included in semiconductor wafer manufacturing system 400 for depositing metal layers 107 and 207 that fills the gate trench. Metal layer deposition chambers can be connected to precursor supplies, such as tungsten or cobalt target and can be introduced with argon gas.

During the deposition of conformal layers in the deposition chambers of semiconductor wafer manufacturing system 400, the deposition chambers are kept under vacuum between the multi-cycle deposition processes and the MHE processes, such that no ambient contact or contamination is introduced. A user may enter a single recipe into a computer processor to control the deposition chamber for performing both the multi-cycle deposition and MHE process. For example, the recipe can include deposition parameters for the first and second precursors in the multi-cycle deposition process, such as pulsing time, purging time, gas flow rate, chamber temperature, chamber pressure, plasma power, substrate bias, and/or any suitable deposition parameters. The recipe can also include processing parameters for the MHE process, such as precursor types, precursor flow rate, chamber pressure, chamber temperature, processing time, and/or any suitable processing parameters. Therefore, the entire deposition process for a conformal layer can be controlled by a single recipe in the same chamber.

Each wafer is assigned with a sequence of operations according to an operating recipe to achieve automatic wafer processing in semiconductor wafer manufacturing system 400. In some embodiments, a substrate is first transferred from load lock chamber 413A and/or 413B to cluster 400A using robot arm 404. The wafer can be sent into chamber 415 or 417 for degassing and then to high-k dielectric layer deposition chamber 401 for dielectric layer deposition. For example, high-k dielectric layers 103 and 203 described above can be deposited in gate trenches using deposition chamber 401. In some embodiments, after a high-k dielectric layer is formed, the wafer can be then transferred from chamber 401 to deposition chamber 403 for the growth of barrier layer 104 or 204. In some embodiments, a barrier layer is optional and the wafer can be transferred from deposition chamber 401 to one of the deposition chambers in cluster 400B for subsequent depositions. For example, the wafer can be transferred to n-type work function layer deposition chamber 405 to deposit an n-type work function layer, in accordance with some embodiments. After the deposition of an n-type work function layer, the wafer can be transferred to p-type work function layer deposition chamber 407 for forming a p-type work function layer used in a p-type device such as a p-MOS or p-type FinFET, in accordance with some embodiments. After the work function layers are deposited, the wafer can then be transferred to blocking layer deposition chamber 409, if necessary. A metal layer used to fill gate trenches can also be deposited in semiconductor wafer manufacturing system 400, in accordance with some embodiments. After the metal layers are formed, the wafer can then be parked to load lock chambers 413A and 413B using robot arms 404 and 408. The vacuum level inside the load lock chambers chamber 413A and 413B are raised to a level comparable to load port 402, and the wafer is then transferred to load port 402 and taken out for subsequent operations. For example, after the formation of the metal gate structure, the wafer containing MOSFET or FinFET structures can undergo additional CMOS processing to form various devices. In some embodiments, the various features include, but is not limited to, lightly doped source/drain regions (n-type and p-type LDD), source/drain (S/D) regions, silicide features, and a contact etch stop layer (CESL). It should be noted that strained structures such as silicon germanium (SiGe) and silicon carbide (SiC) features may be formed in the p-type and/or n-type devices, respectively.

Figure 5:
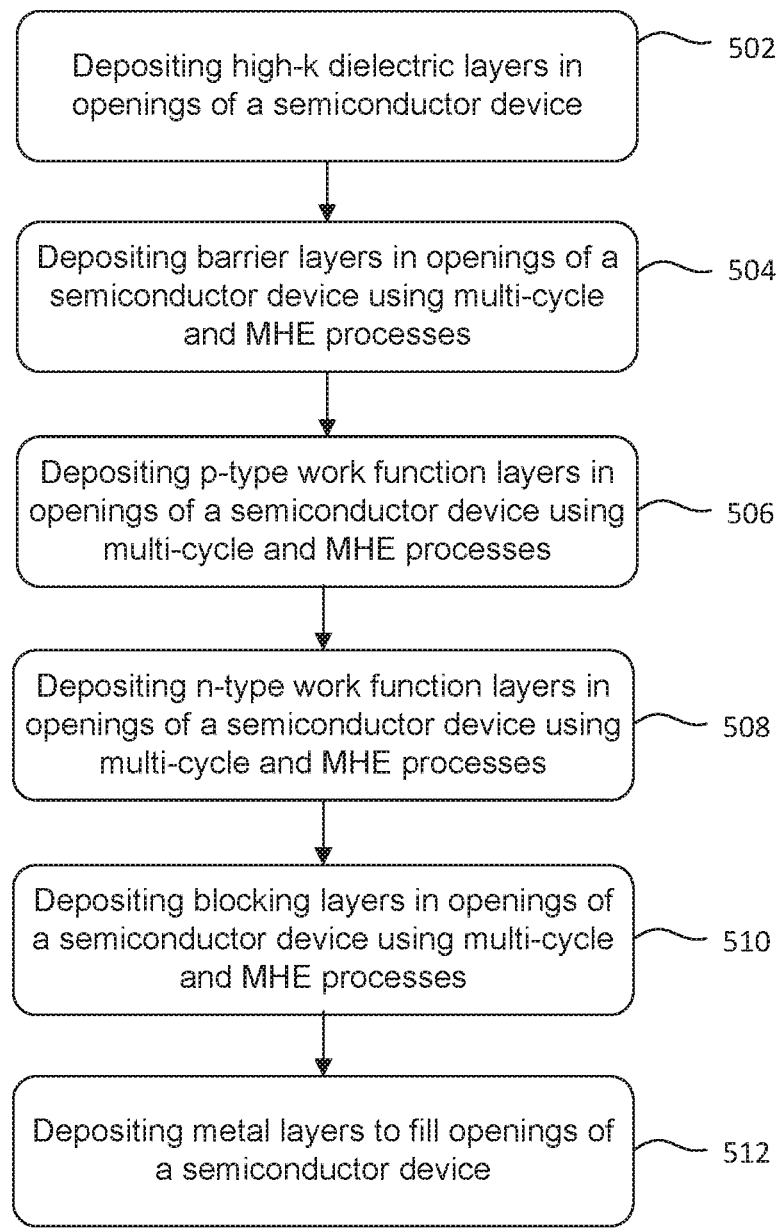
FIG. 5 is a flow diagram of an exemplary method of forming layers using multi-cycle deposition and etching processes, in accordance with some embodiments.

FIG. 5 is a flow diagram of an exemplary method 500 of forming conformal layers with improved step coverage in semiconductor structures, in accordance with some embodiments of the present disclosure. It should be noted that operations of method 500 can be performed in a different order and/or vary, and method 500 may include more operations and are not described for simplicity. It should also be noted that exemplary method 500 can also be used to form conformal layers having improved step coverage in contacts, vias, and/or interconnects. FIGS. 6A-6F are cross-sectional views of fabricating an exemplary semiconductor structure 600 utilizing an in-situ MHE process for forming conformal layers with improved step coverage. FIGS. 6A-6F are provided as exemplary cross-sectional views to facilitate in the explanation of method 500. Semiconductor structure 600 can include shallow trench isolation 615, ILD 609, and spacer 610 which are respectively similar to shallow trench isolation 215, ILD 209, and spacer 310 as described above in FIGS. 2-3B and are not described in detail here for simplicity. In some embodiments, shallow trench isolation 615 can be a portion of a semiconductor substrate.

Figure 6A:
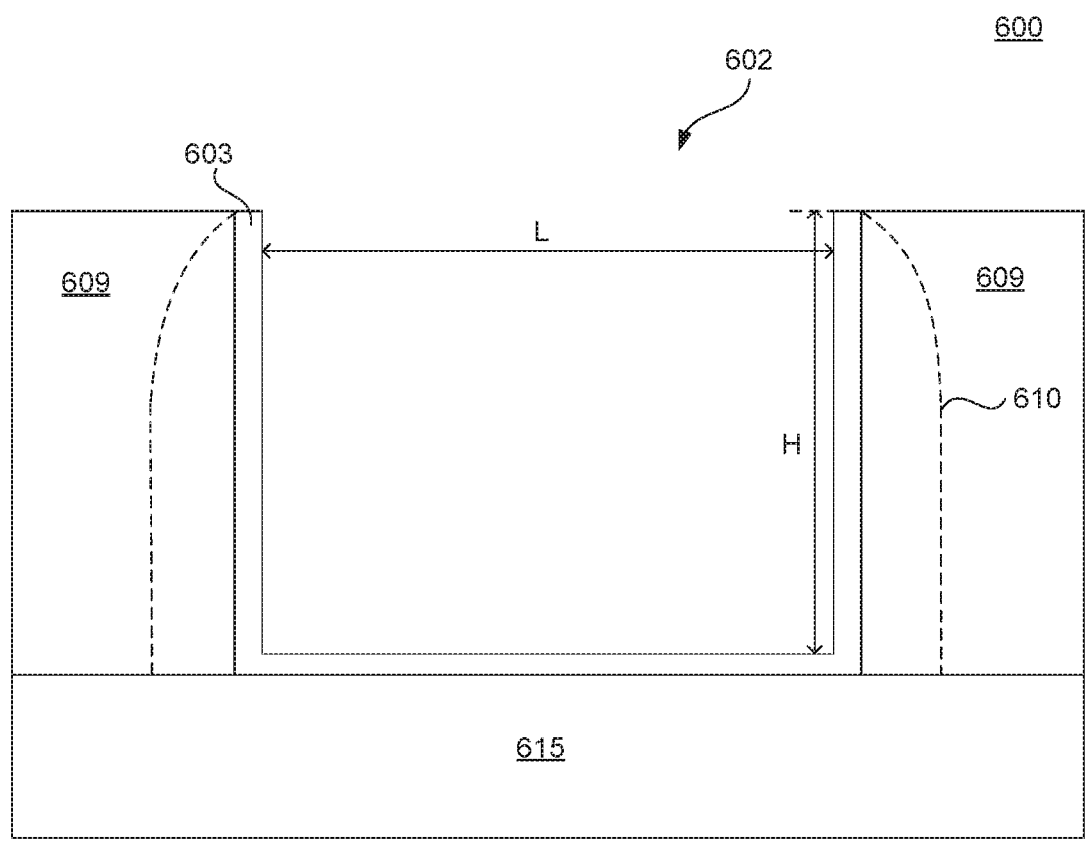
FIGS. 6A-6F are cross-sectional views of semiconductor structures, in accordance with some embodiments.

At operation 502, high-k dielectric layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. Referring to FIG. 6A, a gate trench 602 is formed between exposed sidewall and bottom surfaces of high-k dielectric layer 603. Gate trench 602 can have a high aspect ratio (e.g., between about 6 and about 66) measured by dividing its height H by its width L. High-k dielectric layers can be deposited on sidewalls and bottom of gate trench 602. An example of a high-k dielectric layer is high-k dielectric layer 603 shown in FIG. 6A. High-k dielectric layers can be any suitable material having a dielectric constant greater than 3.9. For example, the high-k dielectric layers can include a high-k dielectric, such as $HfO_x$. In some embodiments, the high-k dielectric layer can include other high-k dielectrics, such as LaO, $Al_2O_3$, ZrO, TiO, $Ta_2O_5$, $Y_2O_3$, STO, BTO, HfSiO, $Si_3N_4$, oxynitrides, any other suitable materials, and/or combinations thereof. High-k dielectric layers can be formed by any suitable process, such as ALD, CVD, MOCVD, PVD, PECVD, PEALD, thermal oxidation, any other suitable deposition techniques, and/or combinations thereof. In some embodiments, the high-k dielectric layer can have a thickness between about 10 Å and about 20 Å. Other examples of high-k dielectric layers can be high-k dielectric layers 103 and 203 as described above in FIGS. 1 and 2.

Figure 6B:
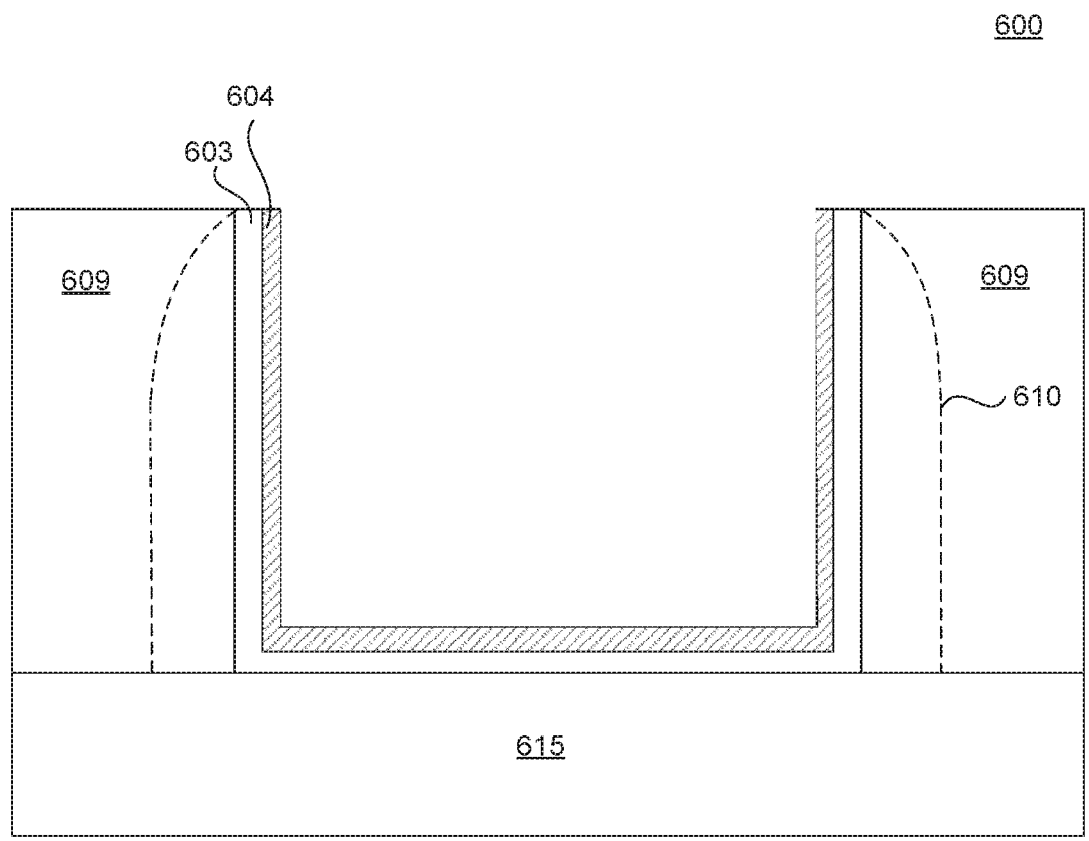

At operation 504, barrier layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. An example of a barrier layer is barrier layer 604 formed on high-k dielectric layer 603, as shown in FIG. 6B. In some embodiments, the barrier layer can include TiN, TaN, any other suitable barrier layer material, and/or combinations thereof. The barrier layer can be formed after the high-k dielectric layer and formed using various deposition techniques, such as ALD, PVD, CVD, PECVD, other suitable deposition processes, and/or combinations thereof. In some embodiments, the barrier layer can have a substantially uniform thickness between about 10 Å and about 30 Å.

In some embodiments, an MHE process can be used with an ALD deposition process to form a conformal barrier layer having improved step coverage. In some embodiments, MHE processes can be used with other suitable deposition processes to provide improved step coverage. In some embodiments, the ALD process used to form the barrier layer can include pulsing a first precursor into a reaction chamber under vacuum for a predetermined amount of time. A first purging process using an inert gas is performed in the reaction chamber to remove any unreacted first precursor material and reaction by-products. A second precursor is then pulsed into the reaction chamber to allow a surface reaction with the first precursor and form one or more atomic layers of barrier layer material. A second purging process is performed in the reaction chamber to remove any unreacted second precursor material and any reaction by-products. This deposition cycle is then repeated until a nominal film thickness of barrier layer is achieved. In some embodiments, MHE processes can be performed after one or more deposition cycles such that overhang can be reduced before the subsequent deposition cycle begins. For example, an MHE process can be performed after each deposition cycle, in accordance with some embodiments. The MHE process can also be performed in intervals after a certain number of deposition cycles. In some embodiments, MHE processes can be performed after a final nominal film thickness is achieved and prior to the deposition process of a different material. The MHE process can efficiently remove overhang formed during the deposition cycle due to greater ion density at the top of the openings compared to the bottom of the openings.

In some embodiments, the chlorine-based or fluorine-based metal precursor for an MHE process can include $WF_x$, $WCl_x$, $TiCl_x$, $TaCl_x$, where 'x' can be equal to about 1-6. In some embodiments, any other suitable precursors can be used. In some embodiments, the deposition cycle and the MHE process are performed in-situ, for example, performed within a processing system such as an ALD cluster tool. In some embodiments, the processing conditions of the MHE process can be similar to the processing conditions used in the MHE process during the formation of barrier layer 104. For example, processing conditions such as temperature, precursor flow rates, chamber pressure, processing time, plasma condition, number of cycles, sequence of cycles, and other processing conditions can be similar between the aforementioned MHE processes. In some embodiments, the processing conditions can be different. Other examples of forming barrier layers using the multi-cycle deposition process and MHE process can be forming barrier layers 104 and 204 as described above in FIGS. 1 and 2.

Figure 6C:
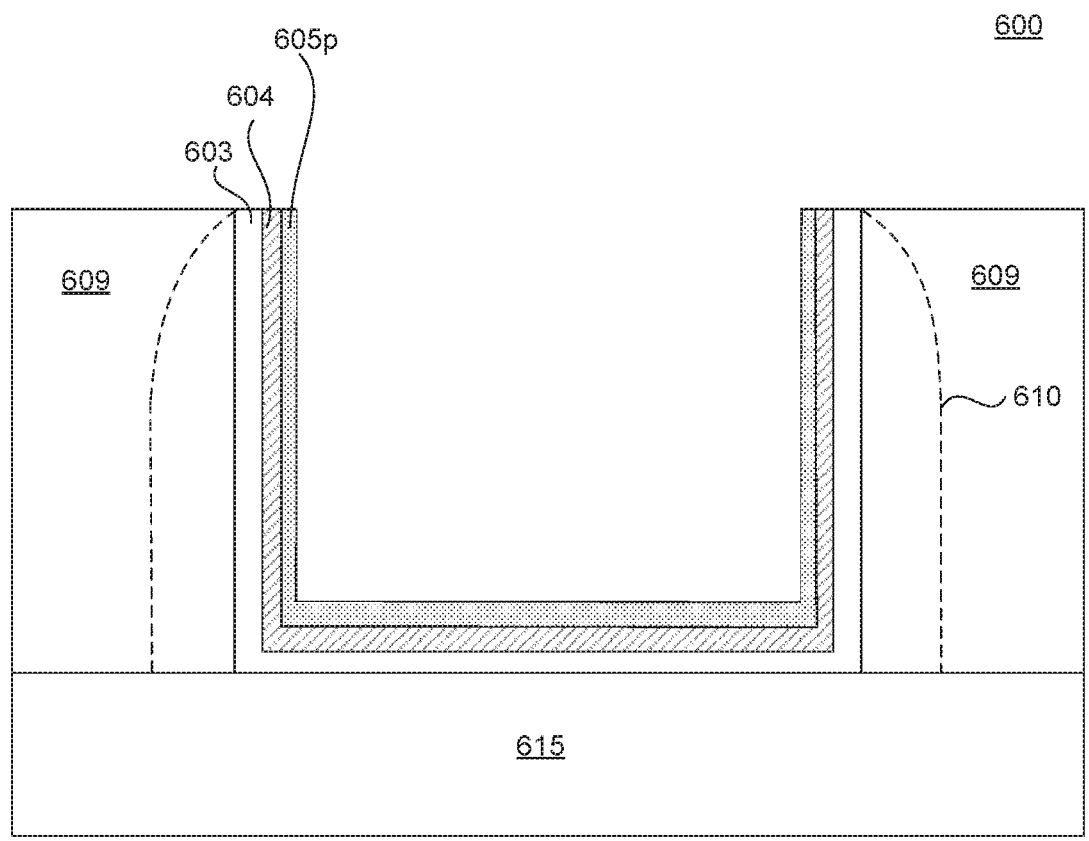

At operation 506, p-type work function layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. In some embodiments, semiconductor transistor device can be a p-type device including a p-type work function layer formed on an n-type work function layer. An example of a p-type work function layer is p-type work function layer 605p formed on barrier layer 604, as shown in FIG. 6C. A p-type work function material deposition process combined with an in-situ MHE process can also provide conformal p-type work function material deposition and improved step coverage. The combined n-type and p-type work function layers can provide appropriate work function value to achieve a nominal transistor threshold voltage for p-type devices. In some embodiments, p-type work function layer can include TiN, HKE-TiN, any other suitable work function layer material, and/or combinations thereof. P-type work function layer can be formed after n-type work function layer and formed using various deposition techniques, such as ALD, PVD, CVD, PECVD, other suitable deposition processes, and/or combinations thereof. In some embodiments, p-type work function layer can have a substantially uniform thickness between about 5 Å and about 50 Å. The MHE process for forming p-type work function layer can include precursors using $WCl_x$, $TaCl_x$, $SnCl_x$, $NbCl_x$, where 'x' can be between about 1 and about 6. In some embodiments, any other suitable precursors can be used. In some embodiments, the processing conditions of the MHE process in a p-type work function layer formation process can be similar to those in the formation processes of n-type work function layer 105. In some embodiments, the processing conditions can be different. Other examples of p-type work function layers can be the p-type work function layers described above with reference to FIGS. 1 and 2.

Figure 6D:
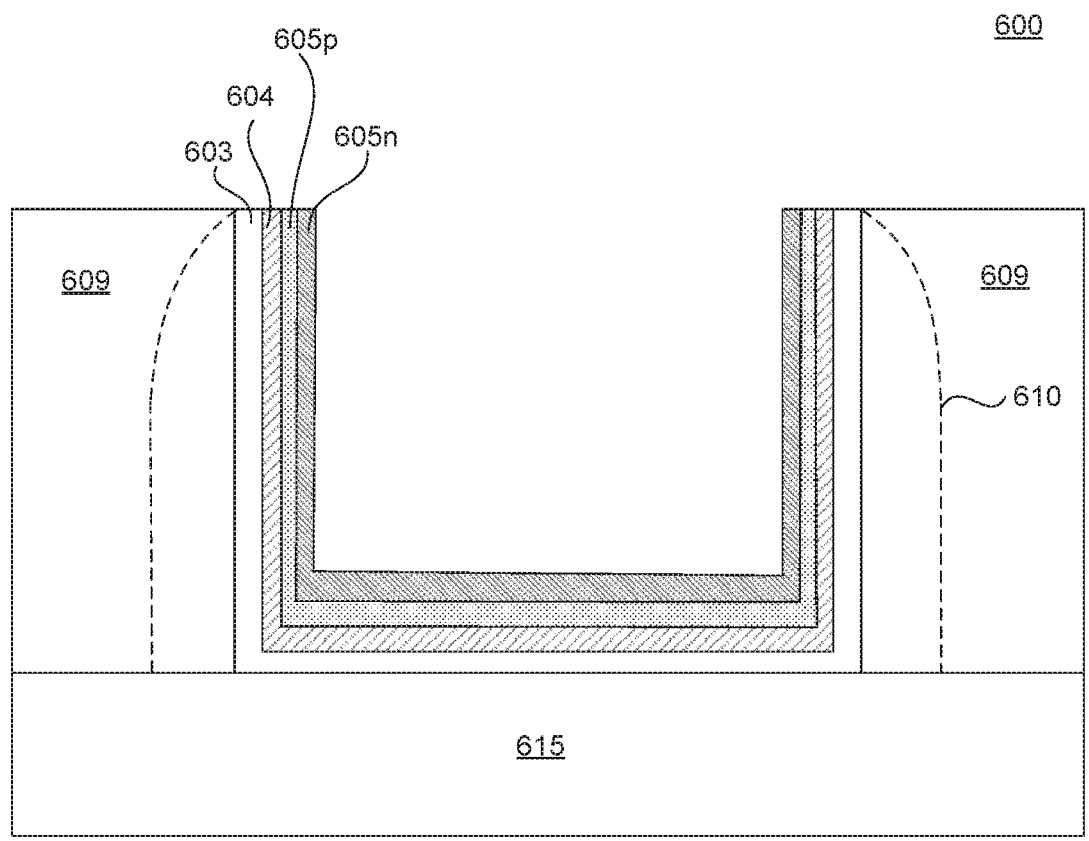

At operation 508, n-type work function layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. One or more N-type work function layers can be deposited on the barrier layer, in accordance with some embodiments. An example of an n-type work function layer is n-type work function layer 605n formed on p-type work function layer 605n, as shown in FIG. 6D. N-type work function layers can provide appropriate work function value to achieve a nominal transistor threshold voltage for a semiconductor transistor device. In some embodiments, an n-type work function layer can include TiAlC, TaAlC, TiSiC, any other suitable n-type work function layer material, and/or combinations thereof. N-type work function layers can be formed after barrier layer deposition and formed using various deposition techniques such as ALD, PVD, CVD, PECVD, other suitable deposition processes, and/or combinations thereof. In some embodiments, n-type work function layers can have a substantially uniform thickness between about 10 Å and about 50 Å. MHE processes can be used with an ALD deposition process to form a conformal n-type work function layers having improved step coverage. In some embodiments, an ALD process used to produce an n-type work function layer can include pulsing a first precursor into a reaction chamber under vacuum for a predetermined amount of time to allow the first precursor to fully react with the substrate surface. Subsequently, a first purging process using an inert gas is performed in the reaction chamber to remove any unreacted first precursor material and reaction by-products. A second precursor is then pulsed into the reaction chamber to allow surface reaction with the first precursor and form one or more atomic layers of n-type work function material. A second purging process is performed in the reaction chamber to remove any unreacted second precursor material and any reaction by-products. The deposition cycle is then repeated until a nominal film thickness of n-type work function material is achieved. In some embodiments, MHE processes can be performed after one or more deposition cycles such that overhang can be reduced before the subsequent deposition cycle begins. For example, an MHE process can be performed after each deposition cycle, in accordance with some embodiments. MHE process can also be performed in intervals after a certain number of deposition cycles. In some embodiments, MHE processes can be performed after a final nominal film thickness is achieved and prior to the deposition process of a different material. MHE process can efficiently remove overhang formed during the deposition cycle due to greater ion density at the top of the openings compared to the bottom of the openings.

In some embodiments, the chlorine-based or fluorine-based metal precursor for an MHE process can include $WCl_x$, $SnCl_x$, $NbCl_x$, $MoCl_x$, where 'x' can be between about 1 and about 6. In some embodiments, any other suitable precursors can be used. In some embodiments, the deposition cycle and the MHE process are performed in-situ, for example, performed within a processing system such as an ALD cluster tool. In some embodiments, the processing conditions of the MHE process can be similar to the processing conditions used in the MHE process during the formation of barrier layer 104. For example, processing conditions such as temperature, precursor flow rates, chamber pressure, processing time, plasma condition, number of cycles, sequence of cycles, and other processing conditions can be similar between the aforementioned MHE processes. In some embodiments, the processing conditions can be different. Other examples of n-type work function layers can be n-type work function layers 105 and 205 as described above in FIGS. 1 and 2.

Figure 6E:
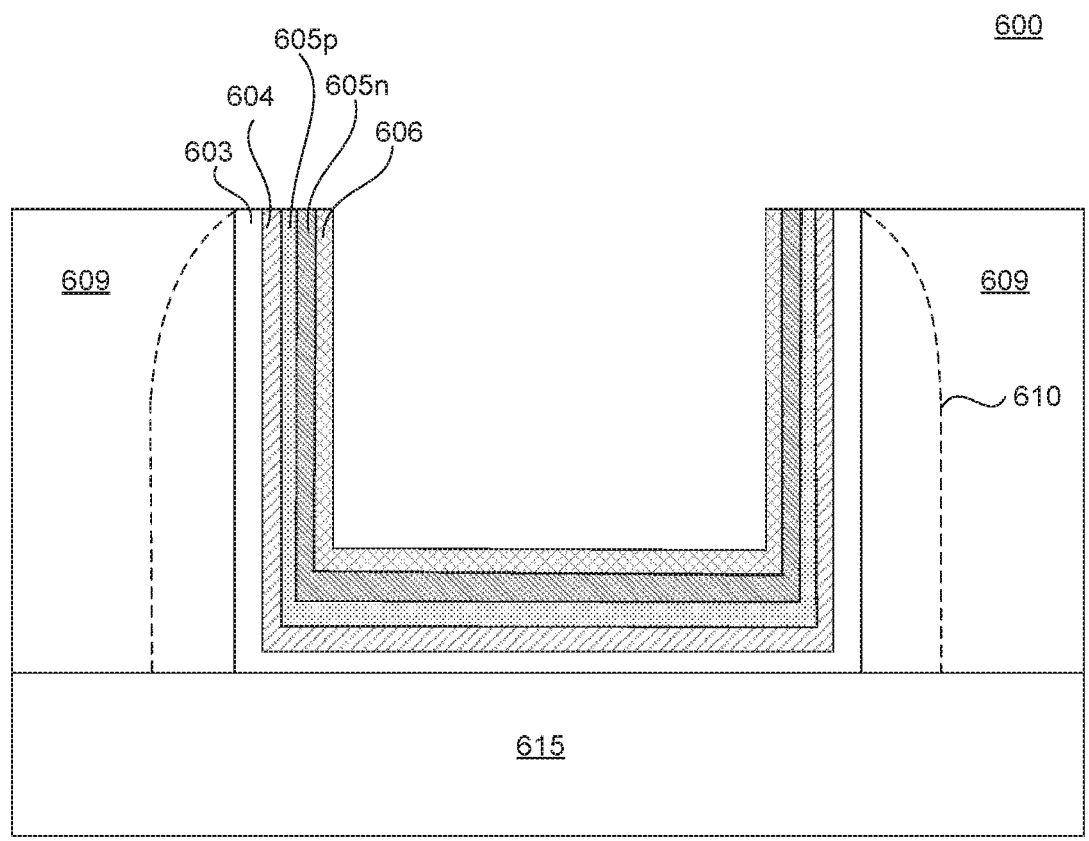

At operation 510, blocking layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. Blocking layers can be formed on n-type or p-type work function layers, in accordance with some embodiments. An example of a blocking layer is blocking layer 606 formed on n-type work function layer 605n, as shown in FIG. 6E. Blocking layers can be formed on the work function layers in an in-situ manner, preventing the underlying work function layer from contamination or oxidation. Blocking layers can also be formed in a different deposition chamber within the same cluster tool or using a different deposition tool. Blocking layers can include TiN, TaN, TSN, any other suitable material, and/or combinations thereof. In some embodiments, blocking layers can have a thickness ranging from about 5 Å to about 40 Å. Blocking layers can be formed by various deposition techniques, such as ALD, PVD, CVD, PECVD, or other suitable techniques. In some embodiments, the blocking layer 106 can be an optional layer that can be removed. Similar to the deposition process of barrier layer and work function layers, a blocking layer deposition process combined with an in-situ MHE process can also provide conformal blocking material deposition and improved step coverage. In some embodiments, the MHE process for forming blocking layer 106 can include precursors, such as $WCl_x$, $SnCl_x$, $NbCl_x$, $MoCl_x$, where 'x' can be between about 1 and about 6. In some embodiments, any other suitable precursors can be used. Other examples of blocking layers can be blocking layers 106 and 206 as described above in FIGS. 1-3B.

Figure 6F:
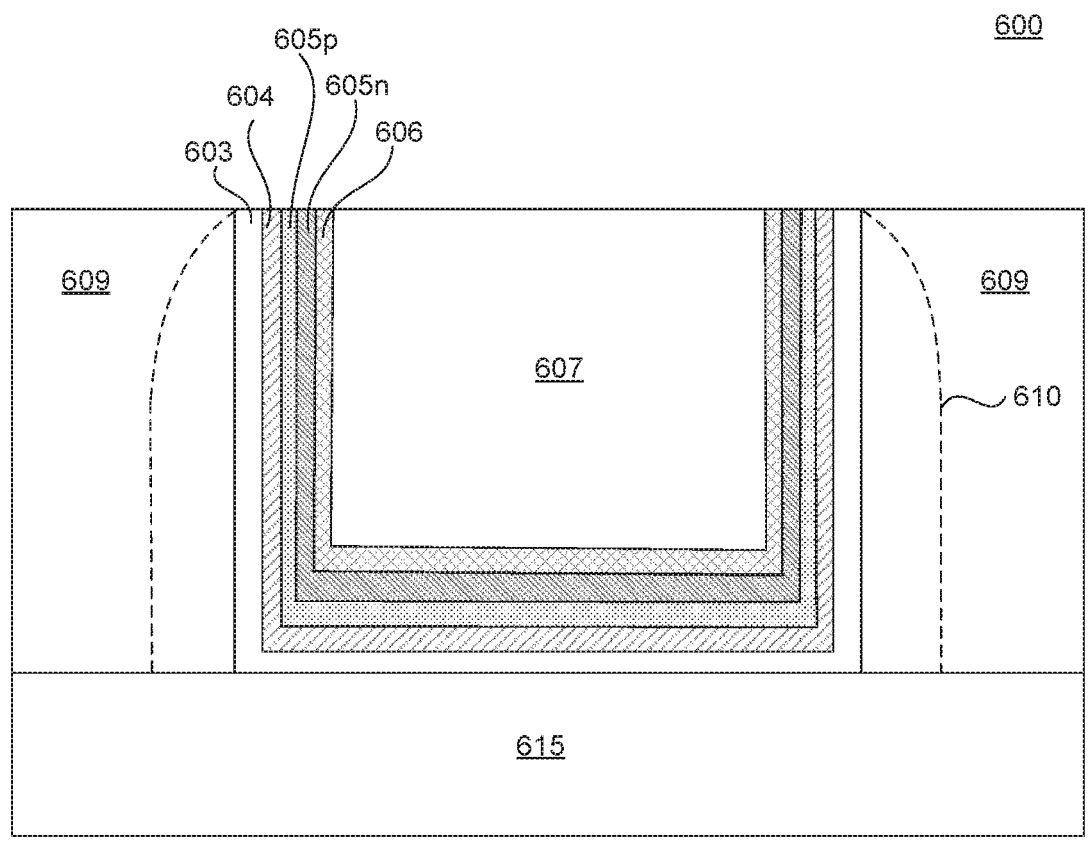

At operation 512, metal layers are deposited in openings of a semiconductor device, in accordance with some embodiments of the present disclosure. The openings can be a high aspect ratio (e.g., greater than 6) opening, such as gate trenches, vias, interconnects, and other high aspect ratio openings. Metal layers can be formed to fill in a remainder of a gate trench in the metal gate stack. An example of a metal layer is metal layer 607 formed on blocking layer 606, as shown in FIG. 6F, Metal layers can include tungsten, WN, TaN, ruthenium, silver, aluminum, any other suitable material, and/or combinations thereof. Metal layers can be formed using a damascene process followed by a planarization process to remove any excessive material formed on the top surface of the ILD layer. Other examples of metal layers can be metal layers 107 and 207 as described above in FIGS. 1-3B. Referring to FIG. 6F, a metal gate stack is formed including barrier layer 604, p-type work function layer 605p, n-type work function layer 605n, blocking layer 606, and metal layer 607. The metal gate stack is formed in gate trench 602 described above in FIG. 6A and can have the same aspect ratio as gate trench 602. Therefore, the metal gate stack can have an aspect ratio between about 6 and about 66.

Various embodiments in accordance with this disclosure provide methods of forming conformal metal layers having improved step coverage in high aspect ratio openings. In some embodiments, the conformal layers formed using methods described in the present disclosure can also include metal compound layers and are collectively described as metal layers for simplicity. The conformal metal layers can be formed using a multi-cycle deposition and in-situ etching process. The formation process can include cycles of deposition processes and in-situ etching processes, such as an MHE process. The MHE process can be performed in-situ between or at the end of the deposition cycles to etch away excessive deposited material and form a conformal metal layer. In some embodiments, the deposited metal layer can be substantially conformal. In some embodiments, the deposited material layer can provide substantially uniform and continuous material coverage on the sidewalls, bottom, and top surface of high aspect ratio openings to achieve improved step coverage. In some embodiments, the multi-cycle deposition process can include an ALD process. In some embodiments, precursors used in the MHE process can include chlorine-based or fluorine-based metal precursors. Nominal thickness and quality of the conformal metal layers can be varied by at least the deposition condition, number of deposition cycles, choices of precursors of the MHE process, number of etching cycles, parameters of the MHE process, other suitable parameters, and/or combinations thereof.

In accordance with various embodiments of this disclosure, using the deposition and in-situ etching process to form conformal gap fill layers in semiconductor structures provides, among other things, benefits of (i) high device reliability and threshold voltage performance due to improved step coverage in high aspect ratio structures; (ii) reduces or eliminates the need for additional dry etching or wet etching process due to MHE etching process; and (iii) avoids contamination and reduces cost by employing an in-situ etching process that is performed in the same deposition chamber.

In some embodiments, a method of fabricating a semiconductor structure includes forming an opening in a substrate and depositing a conformal metal layer in the opening. The depositing includes performing one or more deposition cycles. The deposition includes flowing a first precursor into a deposition chamber and purging the deposition chamber to remove at least a portion of the first precursor. The method also includes flowing a second precursor into the deposition chamber to form a sublayer of the conformal metal layer and purging the deposition chamber to remove at least a portion of the second precursor. The method further includes performing a metallic halide etching (MHE) process that includes flowing a third precursor into the deposition chamber.

In some embodiments, a method of fabricating a semiconductor transistor structure includes forming an opening on a substrate and depositing a barrier layer in the opening. The method also includes depositing a work function layer on the barrier layer using an atomic layer deposition (ALD) process. The method further includes etching, by a metallic halide etching (MHE) process, the work function layer in-situ and depositing a metal layer to fill the opening.

In some embodiments, a semiconductor structure includes a barrier layer over a substrate and a gate stack formed on the barrier layer. The gate stack has an aspect ratio greater than 6 and includes one or more work function layers on the barrier layer. A thickness of the one or more work function layers is between about 5 Å and about 50 Å. The semiconductor structure also includes a metal layer over the one or more work function layers.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method of fabricating a semiconductor structure, comprising:
   flowing a first precursor into a deposition chamber;
   purging the deposition chamber to remove at least a portion of the first precursor;
   flowing a second precursor into the deposition chamber to form a sublayer of a metal layer;
   purging the deposition chamber to remove at least a portion of the second precursor; and
   performing a metallic halide etching (MHE) process that comprises flowing a third precursor into the deposition chamber.

2. The method of claim 1, wherein the MHE process is performed at a temperature between about 200° C. and about 1000° C.

3. The method of claim 1, wherein the first or second precursor comprises at least one of titanium tetrachloride (TiCl$_4$), pentakis-dimethylamino Tantalum (PDMAT), ammonia (NH$_3$), and triethylaluminum (TEA).

4. The method of claim 1, wherein the third precursor comprises a chlorine-based or a fluorine-based metal precursor.

5. The method of claim 1, wherein the third precursor comprises at least one of tungsten fluoride (WF$_x$), tungsten chloride (WCl$_x$), titanium chloride (TiCl$_x$), titanium fluoride (TiF$_x$), tantalum chloride (TaCl$_x$), tin chloride (SnCl$_x$), and molybdenum chloride (MoCl$_x$), wherein x is between about 1 and about 6.

6. The method of claim 1, wherein the MHE process is performed for a time period between about 10 s and about 300 s.

7. The method of claim 1, wherein performing the MHE process comprises performing the MHE process without activation of a plasma.

8. The method of claim 1, wherein the MHE process is performed at a chamber pressure between about 1 Torr and about 20 Torr.

9. The method of claim 1, wherein a flow rate for the third precursor is between about 100 standard cubic centimeters per minute (sccm) and about 12000 sccm.

10. The method of claim 1, wherein performing the MHE process comprises performing the MHE process without exposing the semiconductor structure to an ambient.

11. A method of fabricating a semiconductor transistor structure, comprising:
depositing a barrier layer;
depositing a work function layer on the barrier layer;
etching, by a metallic halide etching (MHE) process, the work function layer in-situ; and
depositing a metal layer on the etched work function layer.

12. The method of claim 11, wherein etching the work function layer comprises performing the MHE process during an atomic layer deposition (ALD) process.

13. The method of claim 11, wherein etching the work function layer comprises performing the MHE process after an ALD process.

14. The method of claim 11, wherein etching the work function layer comprises flowing a precursor into a deposition chamber, wherein the precursor comprises a chlorine-based or a fluorine-based metal precursor.

15. The method of claim 11, wherein the MHE process comprises an etching process without activation of a plasma.

16. The method of claim 11, wherein depositing the work function layer comprises:
flowing a first precursor into a deposition chamber;
purging the deposition chamber to remove at least a portion of the first precursor;
flowing a second precursor into the deposition chamber to form a sublayer of a metal layer; and
purging the deposition chamber to remove at least a portion of the second precursor.

17. A method, comprising:
performing a deposition cycle, comprising:
flowing a first precursor into a deposition chamber;
flowing a second precursor into the deposition chamber to form a sublayer of a metal layer; and
performing a metallic halide etching (MHE) process, comprising flowing a third precursor into the deposition chamber; and
repeating the deposition cycle to form a plurality of sublayers of the metal layer.

18. The method of claim 17, wherein the third precursor comprises at least one of tungsten fluoride ($WF_x$), tungsten chloride ($WCl_x$), titanium chloride ($TiCl_x$), titanium fluoride ($TiF_x$), tantalum chloride ($TaCl_x$), tin chloride ($SnCl_x$), and molybdenum chloride ($MoCl_x$), wherein x is between about 1 and about 6.

19. The method of claim 17, wherein the MHE process is performed without activation of a plasma.

20. The method of claim 17, further comprising:
purging the deposition chamber to remove at least a portion of the first precursor; and
purging the deposition chamber to remove at least a portion of the second precursor.

* * * * *